United States Patent
Shim et al.

(10) Patent No.: US 12,349,543 B2
(45) Date of Patent: Jul. 1, 2025

(54) ELECTROLUMINESCENCE DISPLAY HAVING REPAIR STRUCTURE

(71) Applicant: LG Display Co., Ltd., Seoul (KR)

(72) Inventors: Sungbin Shim, Paju-si (KR); Sangpil Park, Paju-si (KR); Joonsuk Lee, Paju-si (KR); DoYoung Kum, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 502 days.

(21) Appl. No.: 17/966,402

(22) Filed: Oct. 14, 2022

(65) Prior Publication Data
US 2023/0209894 A1 Jun. 29, 2023

(30) Foreign Application Priority Data
Dec. 23, 2021 (KR) ........................ 10-2021-0186109

(51) Int. Cl.
*H10K 59/121* (2023.01)
*H10D 86/40* (2025.01)
(Continued)

(52) U.S. Cl.
CPC ....... *H10K 59/1213* (2023.02); *H10D 86/441* (2025.01); *H10D 86/443* (2025.01);
(Continued)

(58) Field of Classification Search
CPC ........... H10K 59/1213; H10K 59/1216; H10K 59/131; H10K 71/861; H10D 86/60; H10D 86/443; H10D 86/441; H10D 86/423
See application file for complete search history.

(56) References Cited

U.S. PATENT DOCUMENTS 9,129,923 B1  9/2015 Han et al.
9,553,138 B2 * 1/2017 Kim .................... H10K 59/131
(Continued)

FOREIGN PATENT DOCUMENTS

CN  105097867 A  11/2015
CN  111384113 A  7/2020
(Continued)

OTHER PUBLICATIONS

Taiwan Intellectual Property Office, Office Action, Taiwanese Patent Application No. 111140100, Oct. 5, 2023, 20 pages.
(Continued)

*Primary Examiner* — Jose R Diaz
(74) *Attorney, Agent, or Firm* — Fenwick & West LLP

(57) ABSTRACT

An electroluminescence display having a repair structure is disclosed. The electroluminescence display comprises: a substrate, a buffer layer on the substrate, a repair element, and a pixel including a thin film transistor and a light emitting element. The thin film transistor includes a source electrode, a drain electrode, a semiconductor layer, a gate electrode, and a gate insulating layer between the gate electrode and the semiconductor layer. The light emitting element is connected to the drain electrode. The repair element includes a repair line and a repair electrode. The repair line is disposed between the substrate and the buffer layer, and includes a first metal layer on the substrate, and a second metal layer on the first metal layer. The repair electrode is on the buffer layer and the gate insulating layer that covers the repair line and the repair electrode overlaps the repair line.

20 Claims, 10 Drawing Sheets

(51) Int. Cl.
*H10D 86/60* (2025.01)
*H10K 59/131* (2023.01)
*H10K 71/00* (2023.01)

(52) U.S. Cl.
CPC ........... *H10D 86/60* (2025.01); *H10K 59/121* (2023.02); *H10K 59/131* (2023.02); *H10K 71/861* (2023.02)

(56) References Cited

U.S. PATENT DOCUMENTS

| | | | |
|---|---|---|---|
| 9,876,065 | B2 | 1/2018 | Jung |
| 10,014,358 | B2 | 7/2018 | Jung |
| 10,090,369 | B2 | 10/2018 | Kim et al. |
| 10,269,884 | B2 | 4/2019 | Jung |
| 10,403,845 | B2 | 9/2019 | Lee et al. |
| 10,991,917 | B2 | 4/2021 | Cheng |
| 11,164,926 | B2 | 11/2021 | Pang |
| 11,244,987 | B2 | 2/2022 | Kim et al. |
| 2016/0155791 | A1 | 6/2016 | Kim et al. |
| 2016/0189593 | A1 | 6/2016 | Lee et al. |
| 2017/0194403 | A1 | 7/2017 | Jung |
| 2018/0138253 | A1 | 5/2018 | Jung |
| 2018/0301523 | A1 | 10/2018 | Jung |
| 2019/0198799 | A1 | 6/2019 | Lee et al. |
| 2020/0013992 | A1 | 1/2020 | Cheng |
| 2020/0083312 | A1 | 3/2020 | Kim et al. |
| 2020/0161397 | A1 | 5/2020 | Pang |
| 2020/0212131 | A1 | 7/2020 | Kim et al. |
| 2021/0202661 | A1 | 7/2021 | Kim et al. |
| 2022/0013606 | A1 | 1/2022 | Pang |
| 2022/0123069 | A1 | 4/2022 | Kim et al. |
| 2023/0120823 | A1 | 4/2023 | Lee et al. |
| 2023/0171997 | A1* | 6/2023 | Choi .................. H10K 59/1216 257/40 |
| 2023/0209895 | A1* | 6/2023 | Shim ................... H10K 59/131 257/40 |

FOREIGN PATENT DOCUMENTS

| | | |
|---|---|---|
| JP | 2006-235612 A | 9/2006 |
| JP | 2007-121424 A | 5/2007 |
| JP | 2017-120784 A | 7/2017 |
| JP | 2019-121598 A | 7/2019 |
| JP | 2020-532754 A | 11/2020 |
| KR | 10-2016-0064318 A | 6/2016 |
| KR | 10-2019-0024329 A | 3/2019 |
| KR | 10-2020-0058069 A | 5/2020 |
| KR | 10-2020-0079740 A | 7/2020 |
| TW | 202125811 A | 7/2021 |

OTHER PUBLICATIONS

The Japan Patent Office, Office Action, Japanese Patent Application No. 2022-172031, Oct. 31, 2023, 12 pages.

* cited by examiner

FIG. 10
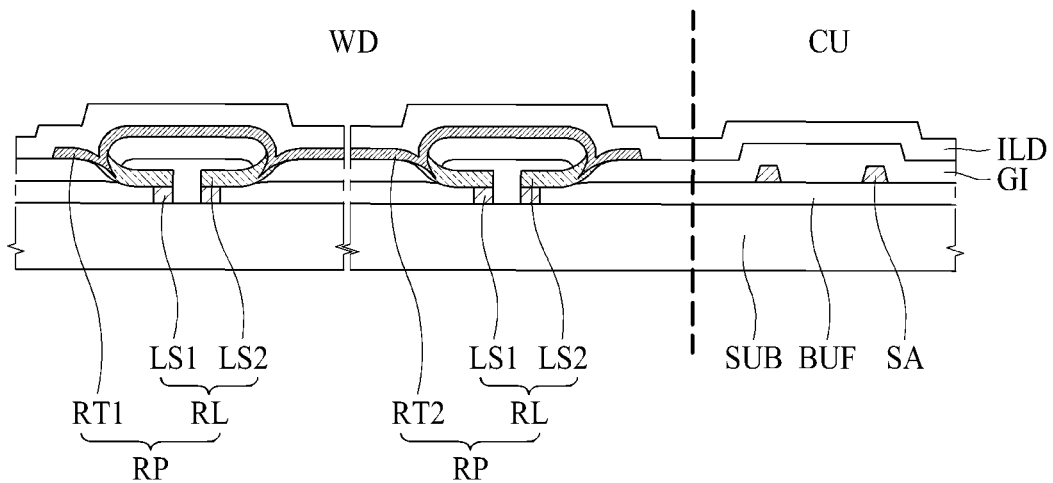
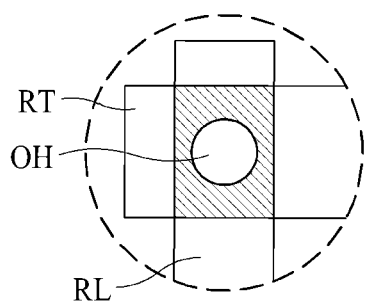
FIG. 11A
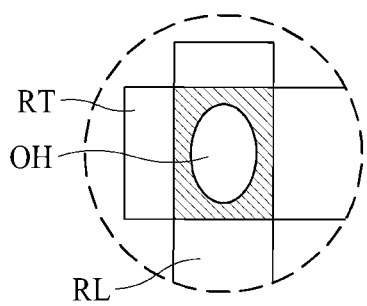
FIG. 11B
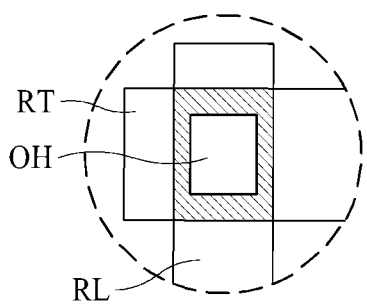
FIG. 11C
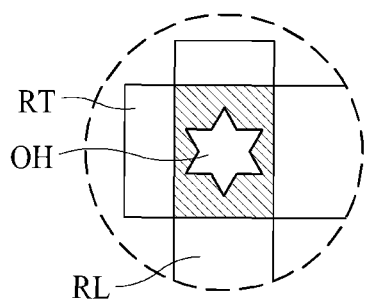
FIG. 11D
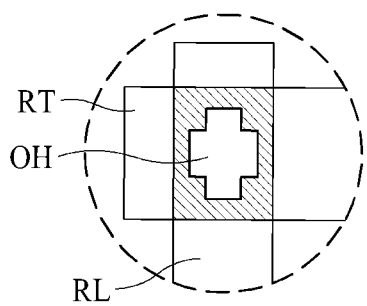
FIG. 11E

ELECTROLUMINESCENCE DISPLAY HAVING REPAIR STRUCTURE

CROSS-REFERENCE TO RELATED APPLICATION

This application claims the benefit of Republic of Korea Patent Application No. 10-2021-0186109 filed on Dec. 23, 2021, which is hereby incorporated by reference in its entirety.

BACKGROUND

Field of Technology

The present disclosure relates to an electroluminescence display having a repair structure. In particular, the present disclosure relates to an electroluminescence display having a repair structure in which a defected pixel is not processed to be a dark (or black) pixel, but is connected (or detoured) with a normal operating neighboring pixel.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the electroluminescent display which is a self-luminous display, has an excellent optical performance such as a viewing angle and color realization degree, so that its application field is gradually widening and is receiving attention as an image display device. Due to these advantages, the electroluminescence display is attracting attention as the most suitable display for realizing a 4K ultra-high-resolution display up to an 8K resolution display. As the resolution is increased, the size of the pixel becomes smaller and the size of the emission area occupied in the pixel also becomes smaller. When the size of the pixel of the electroluminescence display becomes small, it is necessary to secure the size of the emission area as much as possible. To do so, a top emission type structure is applied.

In addition, as the resolution increases, the frequency of occurrence of pixel defects increases due to the electrical connectivity between the elements in the pixel or a defect of one or more elements itself. When a pixel is defected, a dark spot processing may be considered, or a repair method for connecting to a neighboring normal pixel may be considered. The repair element includes a cutting part for breaking the connection between the light emitting element and the defective driving element, and a welding part for bypassing the defective driving element and connecting to neighboring normal driving element. For the ultra-high-resolution electroluminescence display of top emission type, the emission area may be reduced in order to ensure the area for placing the repair element. This is because the laser irradiation area is configured not to overlap the emission area in order not to damage the light emitting element disposed in the emission area during the laser irradiation process for repair.

In other words, when the repair element is disposed as not being overlapped with the emission area, an extra area for the repair element is required within the pixel area, so the emission area may be reduced within the pixel area. Thus, increasing resolution is limited. Accordingly, for the electroluminescence display having a top emission type and ultra-high-resolution structure, it is required to develop a new repair structure capable of solving the resolution limitation problem due to the necessity of an repair element.

SUMMARY

The purpose of the present disclosure, as for solving the problems described above, is to provide an electroluminescence display in which a repair element is overlapped with an emission area to implement the ultra-high resolution. Another purpose of the present disclosure is to provide an electroluminescence display having a repair element that overlaps an emission area and does not damage the light emitting element disposed within the emission area. Another purpose of the present disclosure is to provide an electroluminescence display having a repair structure capable of simultaneously conducting the cutting process and the welding process by irradiating a laser having a low energy level suitable for applying to a semiconductor layer.

In order to accomplish the above mentioned purposes of the present disclosure, an electroluminescence display according to the present disclosure comprises: a substrate; a buffer layer on the substrate; a pixel including a thin film transistor and a light emitting element that is connected to the thin film transistor, the thin film transistor including a source electrode, a drain electrode, a semiconductor layer, and a gate electrode that overlaps the semiconductor layer; a gate insulating layer between the gate electrode and the semiconductor layer; and a repair element that overlaps the light emitting element, the repair element including: a repair line that is electrically connected to the drain electrode of the thin film transistor and disposed between the substrate and the buffer layer, the repair line including a first metal layer on the substrate and a second metal layer on the first metal layer; and a repair electrode that electrically connects the repair line to the drain electrode of the thin film transistor, the repair electrode on the buffer layer and the gate insulating layer, wherein the repair electrode and the gate insulating layer overlap the repair line.

In one embodiment, an electroluminescence display comprises: a first pixel on a substrate, the first pixel including a first switching thin film transistor, a first driving thin film transistor connected to the first switching thin film transistor, and a first light emitting element connected to the first driving thin film transistor; a second pixel on the substrate, the second pixel including a second switching thin film transistor, a second driving thin film transistor connected to the second switching thin film transistor, and a second light emitting element connected to the second driving thin film transistor; and a repair element that overlaps the first light emitting element and the second light emitting element, the repair element including: a repair line that extends from the first pixel to the second pixel, the repair line having a reverse-tapered shape; a first repair electrode connected to a driving drain electrode of the first driving thin film transistor, the first repair electrode disposed at a same layer and having a same material as a gate electrode of the first switching thin film transistor, and the first repair electrode overlapping a first end of the repair line; and a second repair electrode connected to a driving drain electrode of the second driving thin film transistor, the second repair electrode disposed at a same layer and having a same material as a gate electrode of the second switching thin film transistor, and the second repair electrode overlapping a second end of the repair line, and a buffer layer and a gate insulating layer disposed between the repair line and the first repair electrode, and between the repair line and the second repair electrode.

In one embodiment, an electroluminescence display comprises: a first pixel that is configured to emit light, the first pixel including a first switching thin film transistor, a first driving thin film transistor connected to the first switching thin film transistor, and a first light emitting element connected to the first driving thin film transistor; a second pixel that is defective and cannot emit light, the second pixel including a second switching thin film transistor, a second driving thin film transistor connected to the second switching thin film transistor, and a second light emitting element connected to the second driving thin film transistor; a first repair line that extends to the first pixel but not the second pixel without being electrically connected to the first pixel; a first repair electrode connected to the first driving thin film transistor of the first pixel and overlapping the first repair line without the first repair electrode being electrically connected to the first repair line; a second repair line that extends to the second pixel but not the first pixel and is electrically connected to the second pixel; a second repair electrode connected to the second driving thin film transistor and the second repair line, the second repair electrode overlapping the second repair line; and a buffer layer and a gate insulating layer including a first portion disposed between the first repair line and the first repair electrode and having a first seam area with a thickness that is thinner than other areas of the first portion of the buffer layer and the gate insulating layer that overlap the first repair line, and a second portion disposed between the second repair line and the second repair electrode and having a second seam area with a thickness that is thinner than other areas of the second portion of the buffer layer and the gate insulating layer that overlap the second repair line, wherein a portion of the first repair electrode is in the first seam area such that the first portion of the buffer layer and the gate insulating layer are between the first repair line and the first repair electrode preventing the first repair electrode from being connected to the first repair line, and wherein a portion of the second repair electrode is in the second seam area and a physical connection between the portion of the second repair electrode and the second repair line penetrates through the second seam area to connect together the second repair line and the portion of the second repair electrode that is in the second seam area.

The electroluminescent display according to the present disclosure comprises a repair element overlapped with an emission area of the light emitting element. Accordingly, there is no resolution constraint problem caused by the repair element, so it is easy to implement ultra-high resolution. In addition, the cutting process and the welding process for repairing the defected pixel are conducted with low energy using a wavelength band laser of 266 nm. Even though the repair element is disposed overlapping with the light emitting element, the cutting process and the welding process may be simultaneously conducted with a laser having low energy. Therefore, the light emitting element overlapping the repair element is not damaged by thermal energy generated in the repair process. The present disclosure may provide an ultra-high resolution electroluminescence display having a repair structure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 10 is a cross-sectional view illustrating the welding part and the cutting part, after conducting the repair process, in the electroluminescence display according to the other embodiment of the present disclosure.

FIGS. 11A to 11E are plane views illustrating various shapes of the open hole according to another embodiment of the present disclosure.

DETAILED DESCRIPTION

Figure 1:
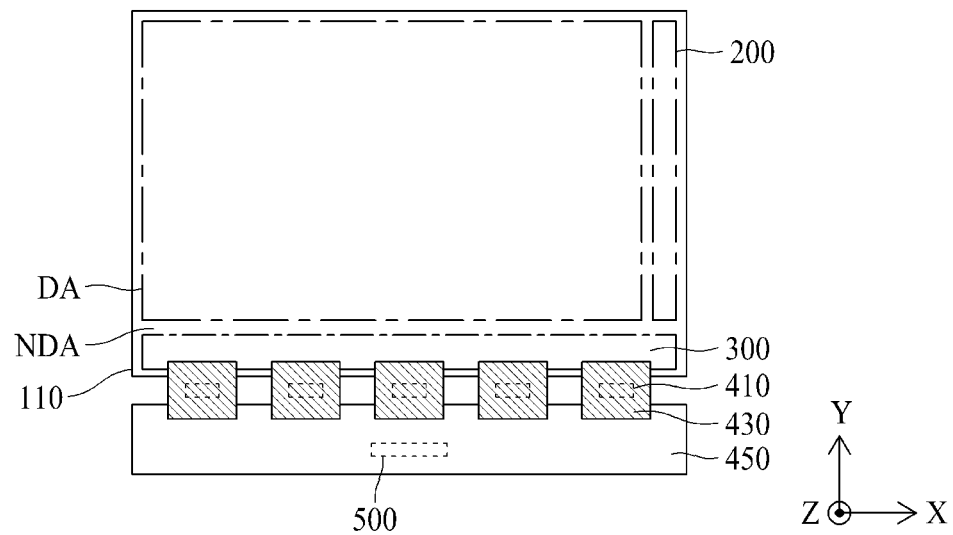
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms do not limit the nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

Hereinafter, referring to attached figures, we will explain about the present disclosure, in detail. FIG. 1 is a diagram illustrating a schematic structure of an electroluminescence display according to the present disclosure. In FIG. 1, the X-axis may be parallel to the extending direction of the scan line, the Y-axis may be parallel to the extending direction of the data line, and the Z-axis may represent the thickness direction of the display.

Referring to FIG. 1, the electroluminescence display comprises a substrate 110, a gate (or scan) driver 200, a data pad portion 300, a source driving IC (integrated circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for representing the still or video images, may be defined as the majority middle area of the substrate 110, but it is not limited thereto. In the display area AA, a plurality of scan lines (or gate lines), a plurality of data lines and a plurality of pixels may be formed or disposed. Each of pixels may include a plurality of sub pixels. Each of sub pixels includes the scan line and the data line, respectively.

The non-display area NDA, which is an area not representing the video images, may be disposed adjacent to the display area AA, or at least partly surrounding the display area AA. For example, the non-display area NDA may be defined at the circumference areas of the substrate 110 surrounding all or some of the display area AA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area AA on the substrate 110, as a GIP (gate driver in panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (tape automated bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
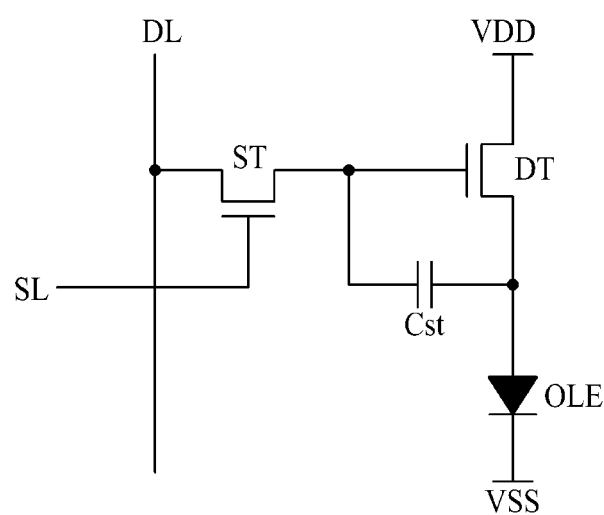
FIG. 2 is a circuit diagram illustrating a structure of one pixel according to one embodiment of the present disclosure.
Figure 3:
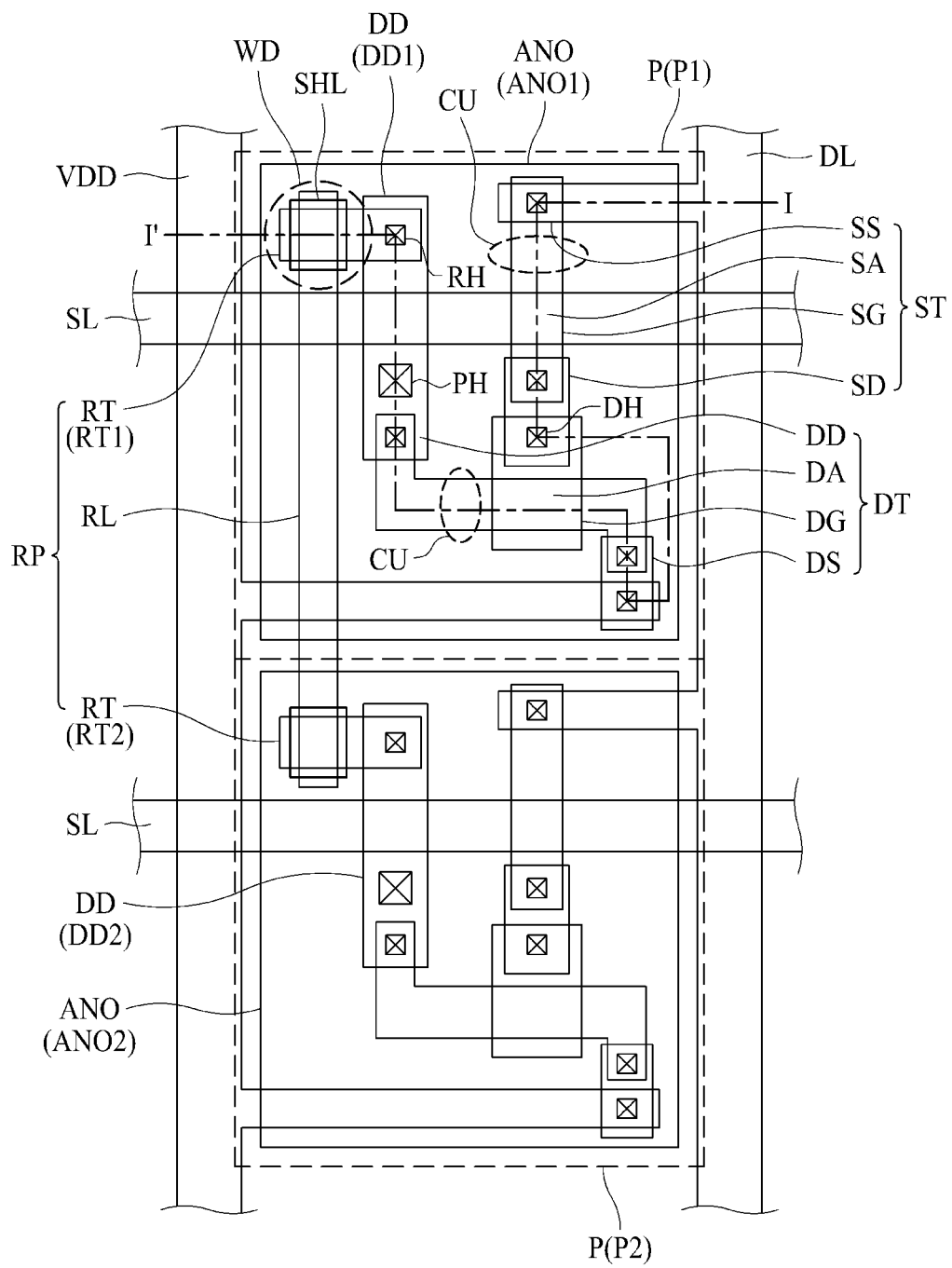
FIG. 3 is a plan view illustrating a structure of the pixels disposed in the electroluminescence display having a repair element according to one embodiment of the present disclosure.
Figure 4:
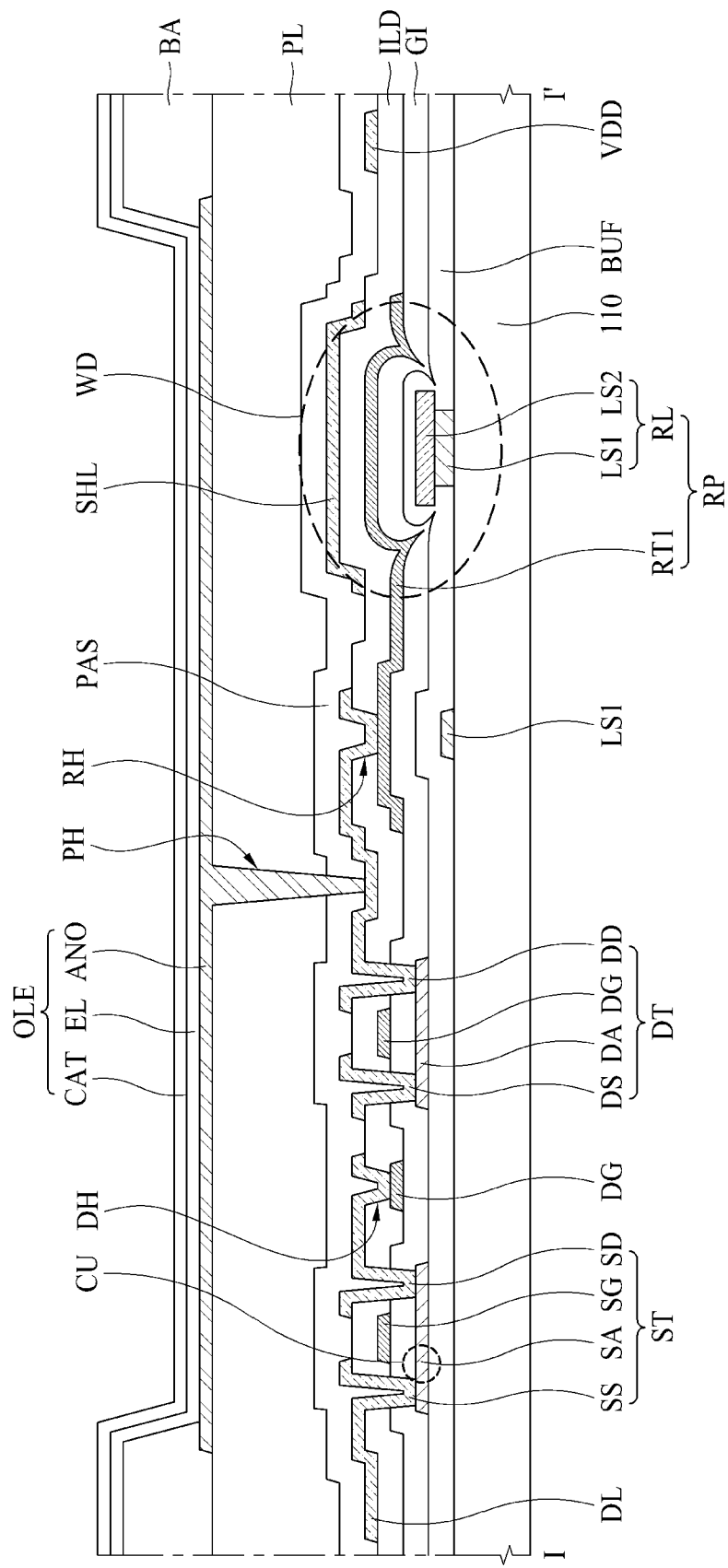
FIG. 4 is a cross-sectional view along to cutting line I-I' in FIG. 3, for illustrating the structure of the electroluminescence display having a repair element according to one embodiment of the present disclosure.

FIG. 2 is a circuit diagram illustrating a structure of one pixel according to one embodiment of the present disclosure. FIG. 3 is a plan view illustrating a structure of the pixels disposed in the electroluminescence display having a repair element according to one embodiment of the present disclosure. FIG. 4 is a cross-sectional view along to cutting line I-I' in FIG. 3, for illustrating the structure of the electroluminescence display having a repair element according to one embodiment of the present disclosure.

Referring to FIGS. 2 to 4, one-pixel P of the light emitting display may be defined by a scan line SL, a data line DL, and a driving current line VDD. One pixel of the light emitting display may include a switching thin film transistor ST, a driving thin film transistor DT, a light emitting diode OLE, and a storage capacitance Cst. The driving current line VDD may be supplied with a high-level voltage for driving the light emitting diode OLE.

For example, the switching thin film transistor ST may be disposed at the portion where the scan line SL and the data line DL is crossing. The switching thin film transistor ST may include a switching gate electrode SG, a switching source electrode SS, and a switching drain electrode SD. The switching gate electrode SG may be connected to the scan line SL, or be one portion of the scan line SL as shown in FIG. 3. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the switching drain electrode SD may be connected to the driving gate electrode DG via a drain contact hole DH penetrating the intermediate insulating layer ILD covering the driving gate electrode DG. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE. In FIGS. 3 and 4, the storage capacitance Cst is not shown in order to avoid the complexity of the drawings.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

FIG. 4 shows that the thin film transistors ST and DT are formed in a top-gate structure. The top gate electrode means that the gate electrodes SG and DG are formed on or over the semiconductor layers SA and DA. For example, in the top gate structure, the semiconductor layers SA and DA are first formed on the substrate 110, and the gate electrodes SG and DG are formed on the gate insulating layer GI covering the semiconductor layers SA and DA. However, it is not limited thereto. For another example, the electroluminescence display according to the present disclosure may have the bottom gate structure. In the bottom gate structure, the gate electrode may be first formed on the substrate and then the semiconductor layer is formed on the gate insulating layer covering the gate electrode.

In addition, for the top gate structure shown in FIG. 4, an intermediate insulating layer ILD may be deposited on the gate electrodes SG and DG. The data line DL, the source electrodes SS and DS, the drain electrodes SD and DD, and the driving current line VDD are disposed on the intermediate insulating layer ILD.

The light emitting diode OLE may include an anode electrode ANO, an emission layer EL, and a cathode electrode CAT. The light emitting diode OLE may emit the light according to the amount of the electric current controlled by the driving thin film transistor DT. In the light emitting diode OLE, the amount of light emitted is controlled by the current controlled by the driving thin film transistor DT, so that the luminance of the electroluminescence display may be adjusted. The anode electrode ANO of the light emitting diode OLE is connected to the driving drain electrode DD of the driving thin film transistor DT, and the cathode electrode CAT is connected to the low power supply line VSS to which a low potential voltage is supplied. In other word, the light emitting diode OLE may be driven by the voltage differences between the low-level voltage and the high-level voltage controlled by driving thin film transistor DT.

A passivation layer PAS is deposited on the surface of the substrate 110 having the thin film transistors ST and DT. In one embodiment, the passivation layer PAS is made of inorganic materials such as silicon oxide or silicon nitride. A planarization layer PL is deposited on the passivation layer PAS. The planarization layer PL may be a film layer for flattening the non-uniform (or uneven) surface of the substrate 110 on which the thin film transistors ST and DT are formed. In order to make the uneven surface condition be uniformed, the planarization layer PL may be made of organic materials. The passivation layer PAS and the planarization layer PL have a pixel contact hole PH exposing some of the driving drain electrode DD of the driving thin film transistor DT.

An anode electrode ANO is formed on the planarization layer PL. The anode electrode ANO is connected to the driving drain electrode DD of the driving thin film transistor DT via the pixel contact hole PH. The anode electrode ANO may have a different structure according to the emission type of the light emitting diode OLE. For example, in the bottom emission type in which the light is emitted to the direction where the substrate 110 is disposed, the anode electrode ANO may be made of transparent conductive materials. For example, in the top emission type in which the light is emitted to the direction opposite the substrate 110, the anode electrode ANO may be made of metal materials having excellent light reflectance.

In the present disclosure, the top emission type is suitable for realization of ultra-high resolution. In the top emission type, the anode electrode ANO has a maximum area in a pixel area defined by the data line DL, the driving current line VDD and the scan line SL according to one embodiment. In this case, the thin film transistors ST and DT may be disposed to overlap with the anode electrode ANO under the anode electrode ANO. In addition, the data line DL, the driving current line VDD and the scan line SL may also partially overlap the anode electrode ANO. In FIG. 3, in order to avoid the complexity of the drawing, the anode electrode ANO is illustrated as being not overlapped with the lines.

A bank BA is formed on the anode electrode ANO. The bank BA may cover the circumference areas of the anode electrode ANO, and expose most of middle portions of the anode electrode ANO. The exposed area of the anode electrode ANO by the bank BA may be defined as an emission area of the pixel.

In the top emission type, the thin film transistors ST and DT may be disposed as being overlapped with the emission area. In addition, some portions of the data line DL, the driving current line VDD and the scan line SL may be overlapped with the emission area.

An emission layer EL is deposited on the anode electrode ANO and the bank BA. The emission layer EL may be deposited on the whole of the display area AA as covering the anode electrode ANO and the bank BA. In an embodiment, the emission layer EL may include two or more emission layers which are vertically stacked for combining and emitting white light. For example, the emission layer EL may include a first emission layer and a second emission layer for combining a first color light and a second color light to emit white light.

In another embodiment, the emission layer EL may include any one of blue emission layer, green emission layer, and red emission layer for providing color light allocated at the pixel. In this case, the emission layer EL may be deposed as being isolated within each emission area defined by the bank BA. In addition, the light emitting diode OLE may further include functional layers for enhancing the emission efficiency and/or the light time of the emission layer EL.

A cathode electrode CAT is deposited on the emission layer EL as being in surface-contact with the emission layer EL. The cathode electrode CAT is deposited as covering whole surface of the substrate 110 as being in connected with the emission layer EL disposed at all pixels. For the top emission type, the cathode electrode CAT may be made of transparent conductive material such as indium-tin-oxide (ITO) or indium-zinc-oxide (IZO) in one embodiment.

The electroluminescence display according to one embodiment of the present disclosure may further comprise a repair element RP. The repair element RP may be a configuration to make any defected pixel operate like normal pixel without darkening the defected pixel.

The repair element RP may include a repair line RL and a repair electrode RT. The repair line RL may have a line segment shape disposed between two adjacent pixels P1 and P2. One end of the repair line RL may be disposed at any one pixel and the other end of the repair line RL may be disposed at another neighboring pixel.

The repair line RL may be first formed on the substrate 110. In particular, the repair line RL may have double-layered structure. For example, the repair line RL may include a first metal layer LS1 and a second metal layer LS2 sequentially stacked each other. In one embodiment, the repair line RL may have a reverse-tapered shape in cross-sectional view. For example, the first metal layer LS1 may have a first width and the second metal layer LS2 may have a second width that is wider than the first width. As a result, the repair line RL may have a reversed-taper structure such as 'T' shape in the cross-sectional view. However, it is not limited thereto. The the first metal layer LS1 may have the same width as the second metal layer LS2 in other embodiments.

The repair line RL is covered by the buffer layer BUF stacked on the whole surface of the substrate 110. In this case, a seam area may be formed at the both side of the repair line RL having the step difference due to the reversed-taper structure. The seam area may be formed by depositing the buffer layer BUF thinner than other portions.

The semiconductor layers SA and DA are formed on the buffer layer BUF. The semiconductor layer SA and DA are covered by the gate insulating layer GI stacked on the whole surface of the substrate 110. The seam area of the buffer layer BUF may be reflected (or regenerated) at the gate insulating layer GI because that the gate insulating layer GI is deposited thinner than other portions. The gate electrodes SG and DG are formed on the gate insulating layer GI as being overlapped with the semiconductor layers SA and DA, respectively. The repair electrode RT includes the same material as the gate electrodes SG and DG and disposed at the same layer with the gate electrode SG and DG. Even when the first metal layer LS1 has the same width with the second metal layer LS2, the seam area may be formed because that the buffer layer BUF and the gate insulating layer GI are deposited on both sides of the second metal layer LS2 as being thinner than other portions.

The repair electrode RT may have a short segment shape extending from a first end to a second end, in which the first end is connected to the driving drain electrode DD connecting to the anode electrode ANO, and the second end is overlapped with the one end of the repair line RL. The second end of the repair electrode RT overlapped with the repair line RL is stacked on the end portions of the seam area such that the end portions of the seam area are covered by the second end of the repair electrode RT. Since the repair electrode RT is stacked while filling the seam area, the separation distance between the repair electrode RT and the repair line RL at the seam area is remarkably shorter (or closer) than other portions.

The gate electrodes SG and DG and the repair electrode RT are covered by the intermediate insulating layer ILD stacked on the whole surface of the substrate 110. The source electrodes SS and DS, the drain electrodes SD and DD, the data line DL and the driving current line VDD are formed on the intermediate insulating layer ILD. The intermediate insulating layer ILD may have a repair contact hole RH exposing the first end of the repair electrode RT. The driving drain electrode DD is extended to the first end of the repair electrode RT and then connected to the repair electrode RT via the repair contact hole RH.

On the repair electrode RT, a repair shielding layer SHL may further include the same material as the driving drain electrode DD and at the same layer with the driving drain electrode DD disposed on the intermediate insulating layer ILD. The repair shielding layer SHL may have an island shape fully covering the second end of the repair electrode RT overlapped with one end of the repair line RL. The repair shielding layer SHL may be a metal layer for preventing or at least reducing heat generated, when one end of the repair line RL and the second end of the repair electrode RT are welded, from being transferred to the light emitting diode OLE disposed thereon.

The passivation layer PAS is deposited on the substrate 110 having the source electrodes SS and DS, the drain electrodes SD and DD, the data line DL, the driving current line VDD and the repair shielding layer SHL. The planarization layer PL is deposited on the passivation layer PAS.

The area where the one end of the repair line RL and the second end of the repair electrode RT are overlapped or the repair shielding layer SHL is disposed may be defined as the welding part WD. The welding part WD may be disposed as being adjacent to the switching semiconductor layer SA of the switching thin film transistor ST. The switching semiconductor layer SA adjacent to the welding part WD may be defined as a cutting part CU. However, it is not limited thereto. The cutting part CU may be defined or disposed at a part of the driving thin film transistor DT.

Figure 5:
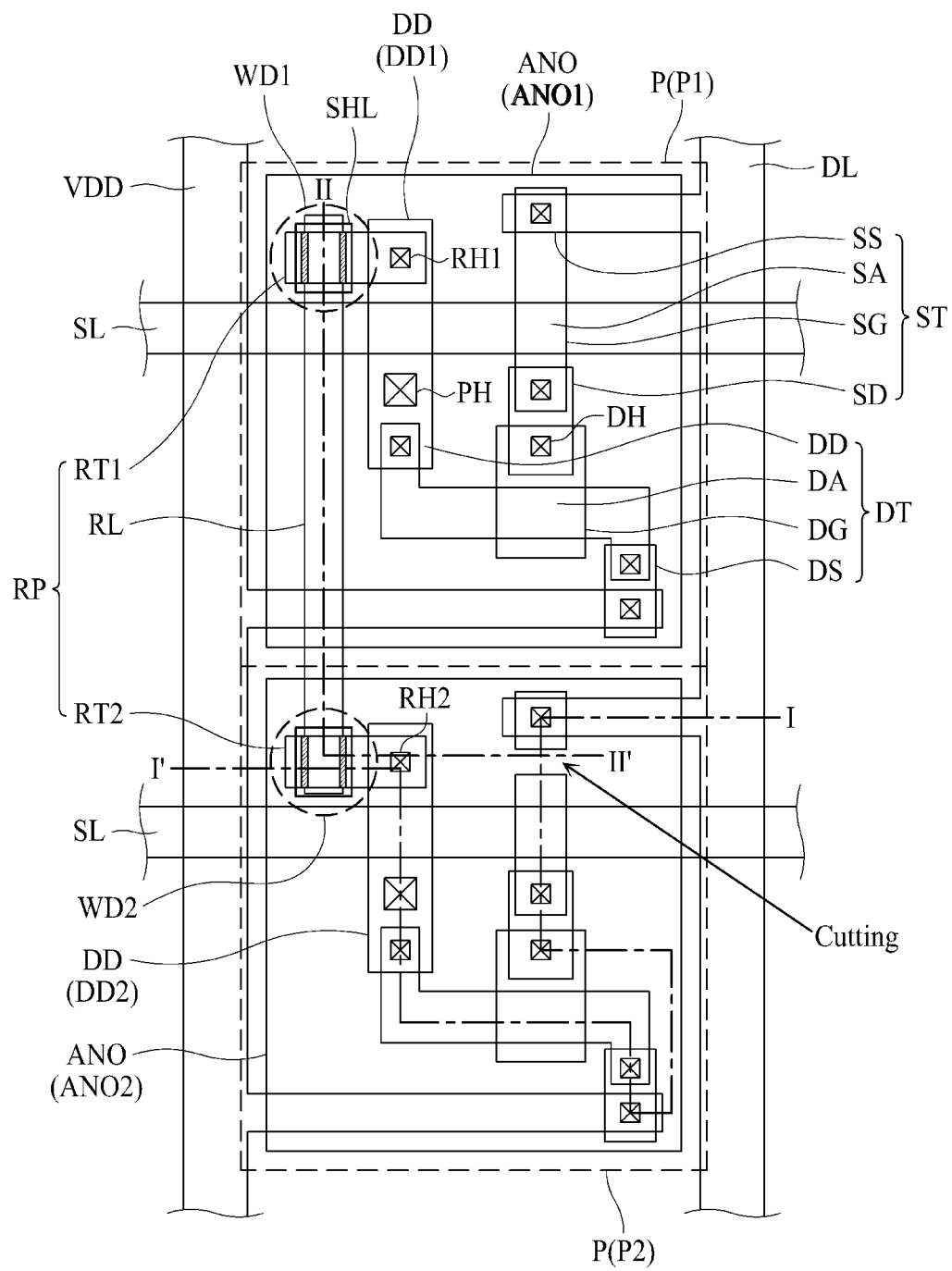
FIG. 5 is a plane view illustrating a structure after conducting a welding and cutting process in the electroluminescence display having a repair structure according to one embodiment of the present disclosure.
Figure 6A:
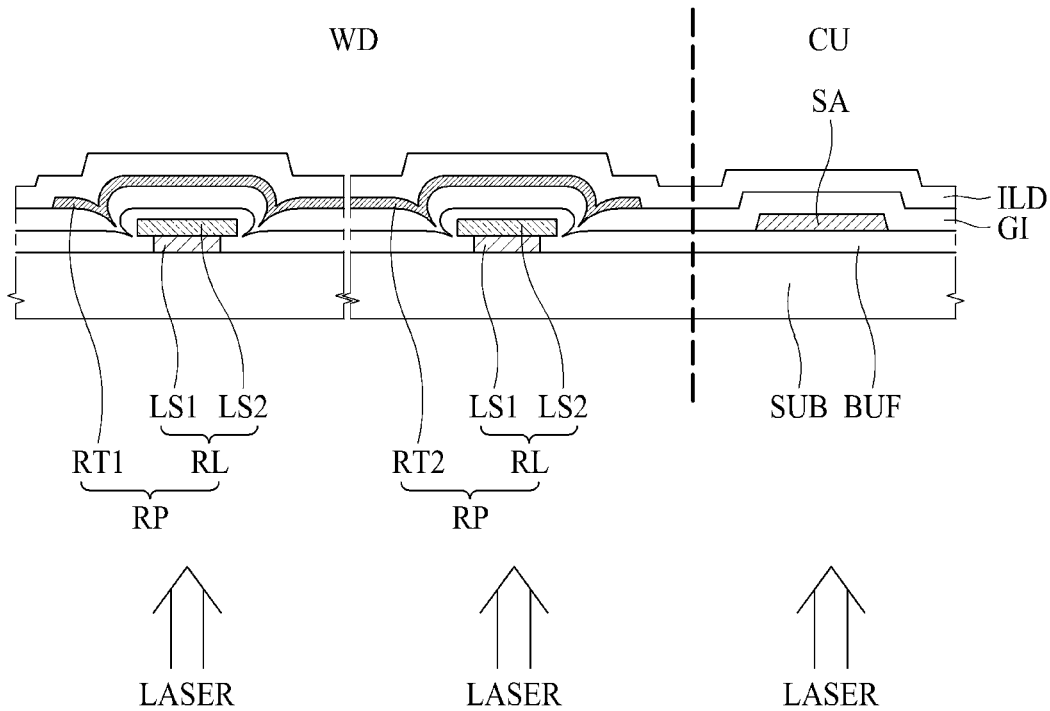
FIG. 6A is a cross-sectional view along line II-II' in FIG. 5, for illustrating a structure of the welding part and cutting part, before conducting the repair process, in the electroluminescence display according to one embodiment of the present disclosure.
Figure 6B:
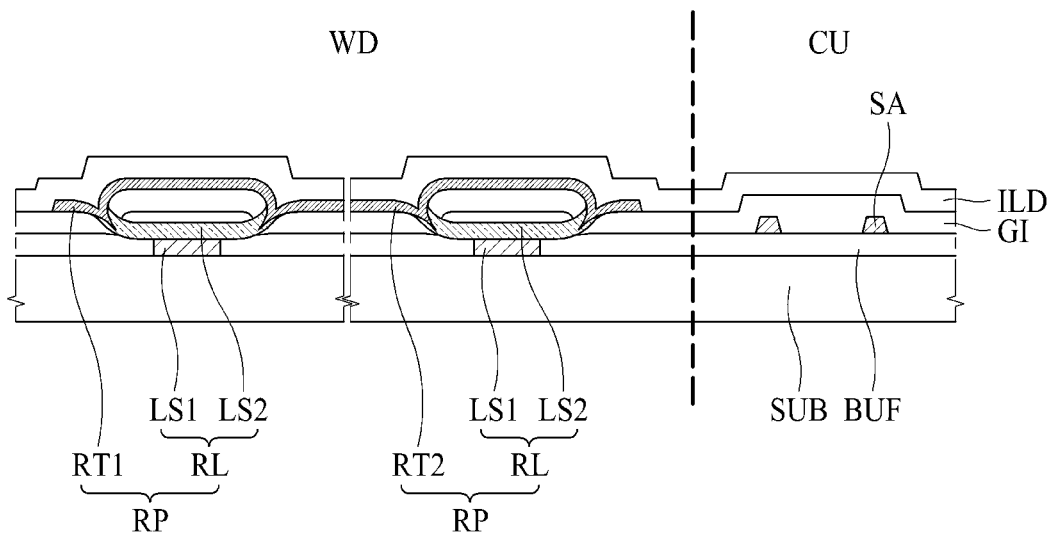
FIG. 6B is a cross-sectional view along line II-II' in FIG. 5, for illustrating a structure of the welding part and cutting part, after conducting the repair process, in the electroluminescence display according to one embodiment of the present disclosure.
Figure 7:
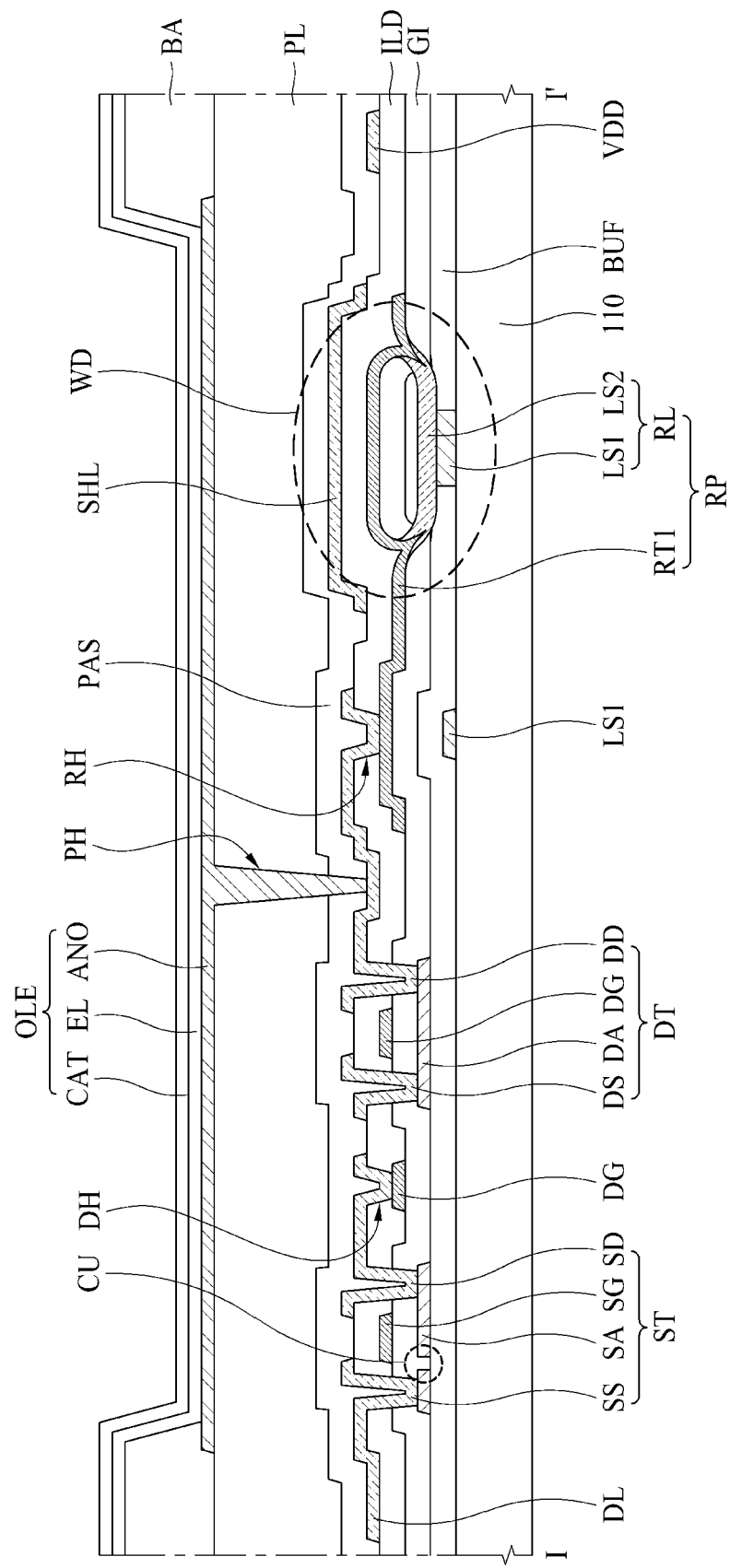
FIG. 7 is a cross-sectional view along line III-III' in FIG. 5, for illustrating a structure, after conducting the welding and cutting process, in the electroluminescence display according to one embodiment of the present disclosure.

The repair element according to the present disclosure may cut the connectivity between the anode electrode of the defected pixel and the thin film transistor connected to the anode electrode, and may make a connection to the driving thin film transistor of the neighboring pixel working normally. Referring to FIGS. 5 to 7, a structure in which, when a defective pixel occurs, the defect is restored or repaired by detouring or connecting to a normal pixel will be explained.

FIG. 5 is a plane view illustrating a structure after conducting welding and cutting process in the electroluminescence display having a repair structure according to one embodiment of the present disclosure. FIG. 6A is a cross-sectional view along line II-II' in FIG. 5, for illustrating a structure of the welding part and cutting part, before conducting the repair process, in the electroluminescence display according to one embodiment of the present disclosure. FIG. 6B is a cross-sectional view along line II-II' in FIG. 5, for illustrating a structure of the welding part and cutting part, after conducting the repair process, in the electroluminescence display according to one embodiment of the present disclosure. FIG. 7 is a cross-sectional view along line III-III' in FIG. 5, for illustrating a structure, after conducting the welding and cutting process, in the electroluminescence display according to one embodiment of the present disclosure.

An electroluminescence display according to the present disclosure may comprise a plurality of pixels P arrayed on a substrate 110 in a matrix manner. For example, as shown in FIG. 5, a first pixel P1 and a second pixel P2 may be disposed as being adjacent to each other. The first pixel P1 may have a first anode electrode ANO1, and the second pixel P2 may have a second anode electrode ANO2. Since the relationship between the thin film transistor and the lines included in each of the pixels P1 and P2 is the same as described above, the detailed description will not be duplicated.

The repair element RP may include a repair line RL, a first repair electrode RT1 and a second repair electrode RT2. The repair line RL may be disposed across from the first pixel P1 to the second pixel P2. The first repair electrode RT1 may be disposed at the first pixel P1 and the second repair electrode RT2 may be disposed at the second pixel P2.

The first repair electrode RT1 may be connected to the first driving drain electrode DD1 connected to the first anode electrode ANO1 disposed at the first pixel P1. In particular, the first end of the first repair electrode RT1 may be connected to the first driving drain electrode DD1 via a first repair contact hole RH1 formed at the intermediate insulating layer ILD covering the first repair electrode RT1. The second end of the first repair electrode RT1 may be overlapped with the repair line RL having the buffer layer BUF and the gate insulating layer GI there-between, in a cross-sectional view.

The second repair electrode RT2 may be connected to the second driving drain electrode DD2 connected to the second anode electrode ANO2 disposed at the second pixel P2. In particular, the first end of the second repair electrode RT2 may be connected to the second driving drain electrode DD2 via a second repair contact hole RH2 formed at the intermediate insulating layer ILD covering the second repair electrode RT2. The second end of the second repair electrode RT2 may be overlapped with the repair line RL having the buffer layer BUF and the gate insulating layer GI there-between, in a cross-sectional view.

One end of repair line RL may be overlapped with the second end of the first repair electrode RT1, and the other end of the repair line RL may be overlapped with the second end of the second repair electrode RT2. As described above, the first repair electrode RT1 and the second repair electrode RT2 are closer to the repair line RL than other areas, at a seam area formed in the buffer layer BUF and/or the gate insulating layer GI. Accordingly, even when a laser having a low energy of a wavelength band of 266 nm is used for example, the repair line RL may be melted and connected to the first repair electrode TRI and the second repair electrode RT2, physically and electrically.

In addition, when a laser having a low energy in a wavelength band of 266 nm is used for example, the semiconductor layers SA and DA may be cut off. By irradiating the same laser having low energy to the welding part WD and the cutting part CU, the welding and cutting processes may be performed simultaneously.

For example, the first pixel P1 may be a normal pixel, and the second pixel P2 may be a defect pixel. The defective pixel may be in a condition in which the anode electrode ANO may not be normally driven because a defect occurs in the switching thin film transistor ST or the driving thin film transistor DT. The second pixel P2 in which the defect has occurred may be darkened. This is a method for disabling the switching thin film transistor ST or the driving thin film transistor DT, which are elements for driving the second anode electrode ANO2 disposed in the second pixel P2. Here, the thin film transistor ST or DT may be disabled by cutting a part of the switching semiconductor layer SA or the driving semiconductor layer DA located closest to the substrate 110.

The present disclosure provides a method and/or a structure of connecting an anode electrode of defective pixel to a driving thin film transistor of neighboring normal pixel rather than darkening the defective pixel. To do so, as shown in FIG. 5, a laser may be irradiated to a part of the switching semiconductor layer SA of the switching thin film transistor ST disposed in the second pixel P2 in which the defect occurs, so that the switching semiconductor layer SA is cut. Here, in one embodiment a laser having low energy in the 266 nm wavelength band may be used. When a laser having high energy in the 1064 nm wavelength band is used, thermal energy is too high and may cause damage to the light emitting diode OLE disposed on the switching semiconductor layer SA.

In addition, the laser having low energy in a wavelength band of 266 nm may be irradiated to the first welding part WD1 in which the second end of the first repair electrode RT1 and one end of the repair line RL are overlapped with each other in the first pixel P1. As the result, the end of the repair line RL is melted and then penetrates through the seam area having a thinner thickness than the other area, so as to be physically and electrically connected to the second end of the first repair electrode RT1 disposed on the repair line RL.

Further, the laser having low energy in a wavelength band of 266 nm may be irradiated to the second welding part WD2 in which the second end of the second repair electrode RT2 and the other end of the repair line RL are overlapped with each other in the second pixel P2. As the result, the other end of the repair line RL is melted and then penetrates through the seam area having a thinner thickness than the other area, so as to be physically and electrically connected to the second end of the second repair electrode RT2 disposed on the repair line RL.

As the result, in the second pixel P2 in which the defect occurs, the switching thin film transistor ST configured to operate the driving thin film transistor DT for driving the second anode electrode ANO2 is disabled. Meanwhile, the second anode electrode ANO2 is connected to the first driving drain electrode DD1 disposed in the first pixel P1 via the repair element RP. Accordingly, the second pixel P2 is in the same operating state as the first pixel P1 and can therefore display the same color as the first pixel P1 and thus a darkening of the defect pixel is avoided.

Since the repair element RP according to the present disclosure can be used to repair the defective pixel to be driven by connecting to the neighboring normal pixel rather than darkening the defective pixel, it is possible to be prevent or at least reduce deterioration of image quality due to the defective pixel. In particular, since the defective pixel operates the same as the neighboring normal pixel, the viewer is kept unaware that the display has any defective problem. Thus, by providing the possibility of repairing high resolution display devices, a higher yield during manufacturing can be achieved. It is further avoided that display devices having a defect might be disqualified or sorted out only due to very few defects.

In the electroluminescence display according to the present disclosure, a laser having low energy in a wavelength band of 266 nm is used for repairing a defective pixel, for example. Since the electroluminescence display according to the present disclosure has a top emission type, both the welding part WD and the cutting part CU are disposed to overlap with the anode electrode ANO and, in particular, the emission area. With this structure, for example, if a laser of a wavelength of 1064 nm mainly used for welding in related art is irradiated from the lower surface of the substrate 110, the high energy may adversely affect to the light emitting diode OLE. That is, even though the repair process may be conducted, the light emitting diode OLE may be damaged and then broken.

However, in the electroluminescence display according to the present disclosure, it is characterized that a laser in a wavelength band of 266 nm suitable for cutting the semiconductor layers SA and DA is used for welding process. That is, the laser having low energy used to cut the semiconductor layer in the cutting part CU is also used for connecting the metal repair electrode RT and the repair line RL in the welding part WD.

Since the repair line RL has a reverse-tapered structure, a seam area is formed at the side edge of the repair line RL where the buffer layer BUF and the gate insulating layer GI covering the repair line RL are deposited with thinner thickness than other areas. At the seam area, the repair electrodes RT1 and RT2 on the gate insulating layer GI have a shorter distance from the repair line RL than other areas. As the result, even with the low energy laser of 266 nm, the repair line RL may be melted, and the repair line RL may be physically and electrically connected to the repair electrodes RT1 and RT2 through the seam area. That is, the cutting process and the welding process may be conducted in a single process using the same laser, rather than that these processes are conducted in separated processes using different lasers.

Without seam area, when the welding process is conducted at the welding part WD with a laser having low energy of 266 nm wavelength band, the repair line RL may be melted but the melted portions cannot penetrate the buffer layer BUF and the gate insulating layer GI covering the repair line RL. As the result, the repair line RL may not be connected to the repair electrodes RT1 and RT2.

Referring to FIG. 6A, a laser having a low energy of 266 nm wavelength may be irradiated to the welding part WD and the cutting part CU. Here, the laser beam may be irradiated on the repair line RL and the switching semiconductor layer SA disposed on the substrate 110. In particular, on the repair line RL, the area including the seam area is irradiated with the laser. As a result, as shown in FIG. 6B, the switching semiconductor layer SA is melted and cut by the thermal energy at the cutting part CU. Since there is no metal material directly overlapping on the switching semiconductor layer SA, the laser energy may not affect other layers. In some cases, the switching gate electrode and the switching source electrode may be partially overlapped with the switching semiconductor layer SA. However even when the switching gate electrode and the switching source electrode are melted and connected each other, the semiconductor layer is cut and its connectivity is broken, so that the switching thin film transistor is disabled.

Meanwhile, at the welding part WD of FIG. 6B, as the repair line RL is melted, the melted portions of the repair line RL passes through the seam area having a thinner thickness than other areas, and then the repair line RL is connected to the repair electrodes RT1 and RT2 disposed thereon. Since the buffer layer BUF and the gate insulating layer GI are very thin at the seam area, the repair line RL may be melted and penetrate the seam area even with low thermal energy.

Referring to FIG. 7, the switching semiconductor layer SA is cut off at the cutting part CU, and the light emitting diode OLE disposed in the second pixel P2 having a defect may be disconnected from the switching thin film transistor ST and the driving thin film transistor DT. However, at the welding part WD, the repair line RL may be connected to the second repair electrode RT2. Further, even though not shown in FIG. 7, the repair line RL may be connected to the first repair electrode RT1 as shown in FIG. 5. Accordingly, the second anode electrode ANO2 is connected to be driven by the first driving drain electrode DD1 through the first repair electrode RT1, the repair line RL and the second repair electrode RT2.

Figure 8:
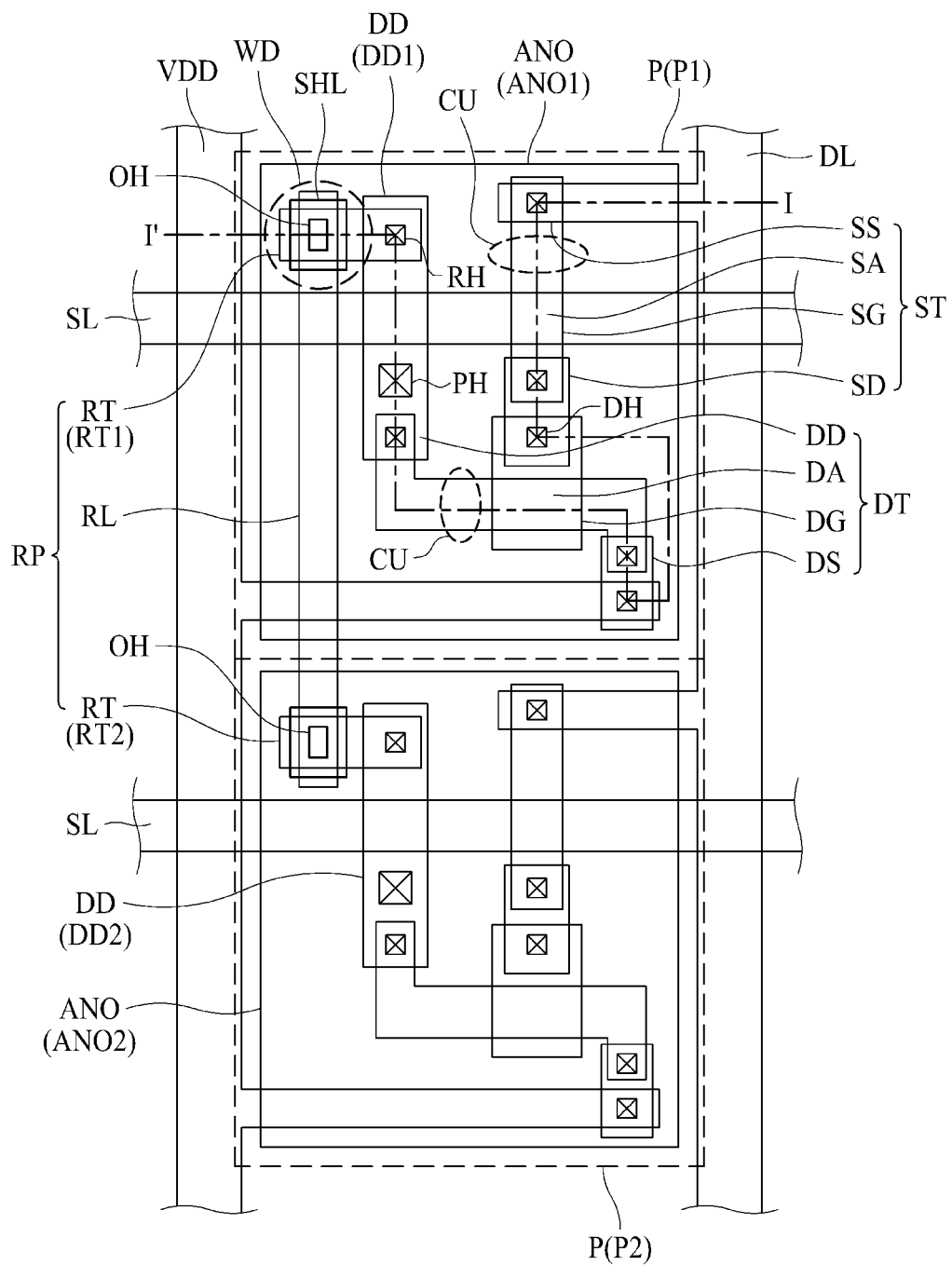
FIG. 8 is a plane view illustrating the structure of the pixels disposed in the electroluminescence display having a repair element according to another embodiment of the present disclosure.
Figure 9:
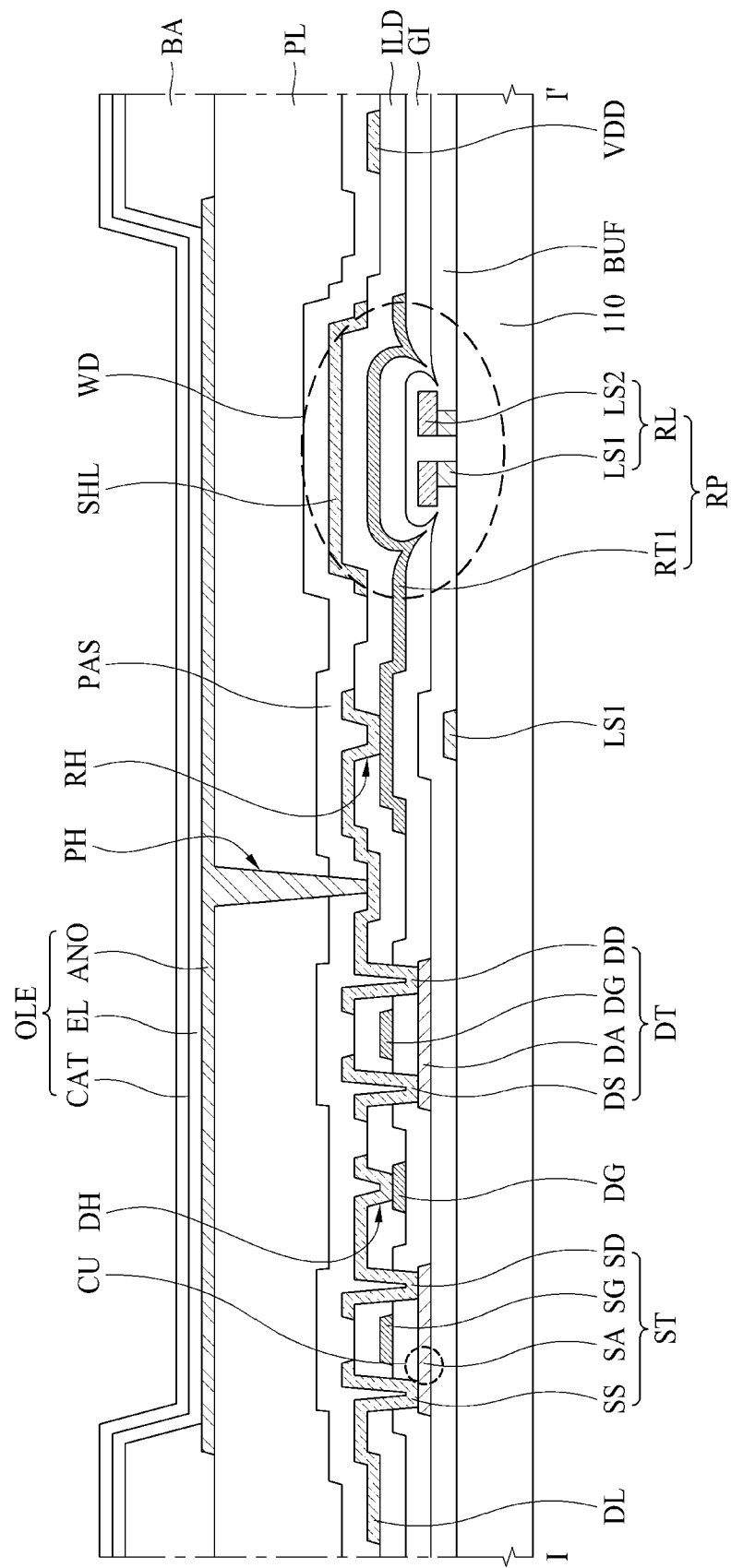
FIG. 9 is a cross-sectional view along line IV-IV' in FIG. 8, illustrating a structure of an electroluminescence display having a repair element according to the other embodiment of the present disclosure.

Hereinafter, referring to FIGS. 8 to 10, another embodiment of the present disclosure will be described. FIG. 8 is a plane view illustrating the structure of the pixels disposed in the electroluminescence display having a repair element according to the other embodiment of the present disclosure. FIG. 9 is a cross-sectional view along line IV-IV' in FIG. 8, illustrating a structure of an electroluminescence display having a repair element according to the other embodiment of the present disclosure. FIG. 10 is a cross-sectional view illustrating the welding part and the cutting part, after conducting the repair process, in the electroluminescence display according to the other embodiment of the present disclosure.

Referring to FIG. 8, the other embodiment of the present disclosure may be same with the embodiment explained with FIG. 3 with some differences. The different point is that an open hole OH may be formed at portions overlapping the repair electrodes RT1 and RT2 at both ends of the repair line RL. The open hole OH may be an element for preventing or at least reducing the buffer layer BUF and the gate insulating layer GI from swelling thereby preventing or at least reducing damage to the anode electrode ANO and the emission layer EL stacked thereon. The swelling may be caused by that thermal energy applied during the welding process is concentrated at portions where the repair line RL and the repair electrodes RT1 and RT2 are overlapped.

Hereinafter, with reference to the figures, it will be briefly described. Since descriptions of the same elements using the same numerical reference as those of FIGS. 3 and 4 are not duplicated, the description may refer to FIGS. 3 to 7, if required.

Referring to FIG. 8, an electroluminescence display according to the other embodiment of the present disclosure comprises a repair element RP. The repair element RP may include a repair line RL and a repair electrode RT. The repair line RL may have a line segment shape disposed between two neighboring pixels P1 and P2. The repair line RL may have one end disposed at one pixel and another end disposed another pixel.

The repair line RL may be first formed on the substrate 110. In particular, the repair line RL may have a double-layered structure. For example, the repair line RL may include a first metal layer LS1 and a second metal layer LS2 sequentially stacked. In one embodiment, the repair line RL may have a reverse-tapered structure in the cross-sectional view. For example, the first metal layer LS1 may have a first width, and the second metal layer LS2 may have a second width that is wider than the first width. Accordingly, the repair line RL may have a reverse-tapered shape such as 'T' shape in a cross-sectional view. However, it is not limited thereto. The width of the first metal layer LS1 may be same with the width of the second metal layer LS2.

The repair line RL may be covered by the buffer layer BUF stacked on the entire surface of the substrate 110. In this case, at the both sides of the repair line RL having the level difference due to the reverse-tapered structure, a seam area in which the buffer layer BUF is stacked with thinner thickness than other areas may be formed. In the case that the width of the first metal layer LS1 is the same with the width of the second metal layer LS2, the seam area in which the buffer layer BUF and the gate insulating layer GI are formed thinner than the other area in both side edge of the second metal layer LS2 may be also formed.

The semiconductor layers SA and DA are formed on the buffer layer BUF. The semiconductor layers SA and DA may be covered by the gate insulating layer GI stacked on the entire surface of the substrate 110. At the seam area of the buffer layer BUF, the gate insulating layer GI may be stacked with thinner thickness than other areas so that the seam area may be reproduced on the gate insulating layer GI. The gate electrodes SG and DG are formed on the gate insulating layer GI as overlapping with the semiconductor layers SA and DA. Furthermore, the repair electrode RT is formed on the same layer and of the same material with the gate electrodes SG and DG.

The repair electrode RT may have a short line segment shape including a first end connected to the driving drain electrode DD connecting to the anode electrode ANO allocated to one pixel P, and a second end extended from the first end to be overlapped with one end of the repair line RL. The second end of the repair electrode RT overlapped with the repair line RL may be formed as fully covering the seam area. Since the repair electrode RT may be formed as filling the seam area, the distance between the repair electrode RT and the repair line RL at the seam area may be remarkably shorter than that of other areas.

The gate electrodes SG and DG and the repair electrode RT may be covered by the intermediate insulating layer ILD stacked on the entire surface of the substrate 110. The source electrodes SS and DS, the drain electrodes SD and DD, the data line DL and the driving current line VDD are formed on the intermediate insulating layer ILD. The intermediate insulating layer ILD may have a repair contact hole RH exposing a part of the first end of the repair electrode RT. The driving drain electrode DD may be extended to the first end of the repair electrode RT, so that it may be connected to the repair electrode RT via the repair contact hole RH.

Meanwhile, a repair shielding layer SHL may be further formed at the same layer and of the same material with the driving drain electrode DD disposed on the intermediate insulating layer ILD on the repair electrode RT. The repair shielding layer SHL may have an island shape fully covering the second end of the repair electrode RT overlapped with another end of the repair line RL. The repair shielding layer SHL may be a metal layer for preventing or at least reducing heat (or thermal energy) generated when one end of the repair line RL and the second end of the repair electrode RT are welded from being transferred to the light emitting diode OLE disposed thereon.

The portion where one end of the repair line RL and the second end of the repair electrode RT are overlapped each other, or the repair shielding layer SHL is disposed may be defined as the welding part WD. The welding part WD may be disposed adjacent to the switching semiconductor layer SA of the switching thin film transistor ST. The switching semiconductor layer SA adjacent to the welding part WD may be defined as the cutting part CU. However, it is not limited thereto. The cutting part CU may be defined at a portion of the driving thin film transistor DT.

In particular, at the welding part WD, the open hole OH is formed at both ends of the repair line RL, respectively. When heat (or thermal energy) is applied to the welding part WD with a laser, the thermal energy may be more rapidly concentrated through the metal. Therefore, the thermal energy may be concentrated at the edges (e.g., circumferences) of the repair line RL around the open hole OH, so that relatively low thermal energy may be concentrated to the open hole OH.

As the result, even with a small amount of the thermal energy, the repair line RL may be melted and then welded to the repair electrode RT disposed thereon. Further, since thermal energy is not concentrated to the open hole OH, the transfer of thermal energy into the elements positioned above the open hole OH may be reduced. That is, the electroluminescence display according to the present disclosure is characterized in that the light emitting diode OLE and the repair electrode RT are overlapped with each other, so that the heat applied to the repair electrode RT may not damage the light emitting diode OLE.

According to the present disclosure, one end of the repair line RL may be overlapped with the second end of the first repair electrode RT1, and another end of the repair line RL may be overlapped with the second end of the second repair electrode RT2. At the seam area of the buffer layer BUF and/or the gate insulating layer GI, the first repair electrode RT1 and the second repair electrode RT2 may be formed with thinner thickness than other areas, as described above. Accordingly, even when a laser having low energy in the 266 nm wavelength band is used, the repair line RL may be melted and then connected to the first repair electrode RT1 and the second repair electrode RT2, physically and electrically.

In addition, by using the laser having a low energy in a wavelength band of 266 nm, the semiconductor layers SA and DA may be cut off. Accordingly, the welding process and the cutting process may be conducted by irradiating the same LASER having low energy to the welding part WD and the cutting part CU.

The laser having a low energy of 266 nm wavelength may be irradiated at the welding part WD and the cutting part CU. Here, the LASER may be irradiated to the repair line RL and the switching semiconductor layer SA disposed on the substrate 110. In particular, the LASER is irradiated to the periphery of the open hole OH disposed close to the seam area. As a result, as shown in FIG. 10, the switching semiconductor layer SA may be melted and cut by thermal energy at the cutting part CU. Since there is no metal material directly overlapped with the switching semiconductor layer SA, the laser energy may not affect other layers thereon. In some cases, the switching gate electrode and the switching source electrode may be partially overlapped with the switching semiconductor layer SA. However even when the switching gate electrode and the switching source electrode are melted and connected each other, the semiconductor layer is cut and its connectivity is broken, so that the switching thin film transistor is disabled.

Meanwhile, at the welding part WD, as the repair line RL is melted, the melted portions of the repair line RL passes through the seam area having a thinner thickness than other areas, and then the repair line RL is connected to the repair electrodes RT1 and RT2 disposed thereon. Since the buffer layer BUF and the gate insulating layer GI are very thin at the seam area, the repair line RL may be melted and penetrate the seam area even with low thermal energy.

Hereinafter, referring to FIGS. 11A to 11E, various shapes of the open holes OH formed at both ends of the repair line RL according to the other embodiment of the present disclosure will be described. FIGS. 11A to 11E are plane views illustrating various shapes of the open hole according to the other embodiment of the present disclosure. The open hole OH according to another embodiment of the present disclosure may have any one of various shapes. For example, the open hole OH may have a circular shape, a rectangular shape, a hexagonal shape or other polygonal shapes. Further, the open hole OH may have a shape as being overlapped with some end part of the repair electrode RT at the end portion of the repair line RL.

For example, as shown in FIGS. 11A to 11E, the open hole OH may have any one of a circular shape as shown in FIG. 11A, an elliptical shape as shown in FIG. 11B, a polygonal shape such as a rectangular shape as shown in FIG. 11C, a star shape as shown in FIG. 11D, a cross shape as shown in FIG. 11E, and other various shapes. The hatched portions in FIGS. 11A to 11E are the portions where the repair electrode RT overlaps with the portion except for the open hole OH formed at the end of the repair line RL. The hatched portion is a region where the repair line RL and the repair electrode RT are melted and then joined by a repair process using a LASER.

Figure 12:
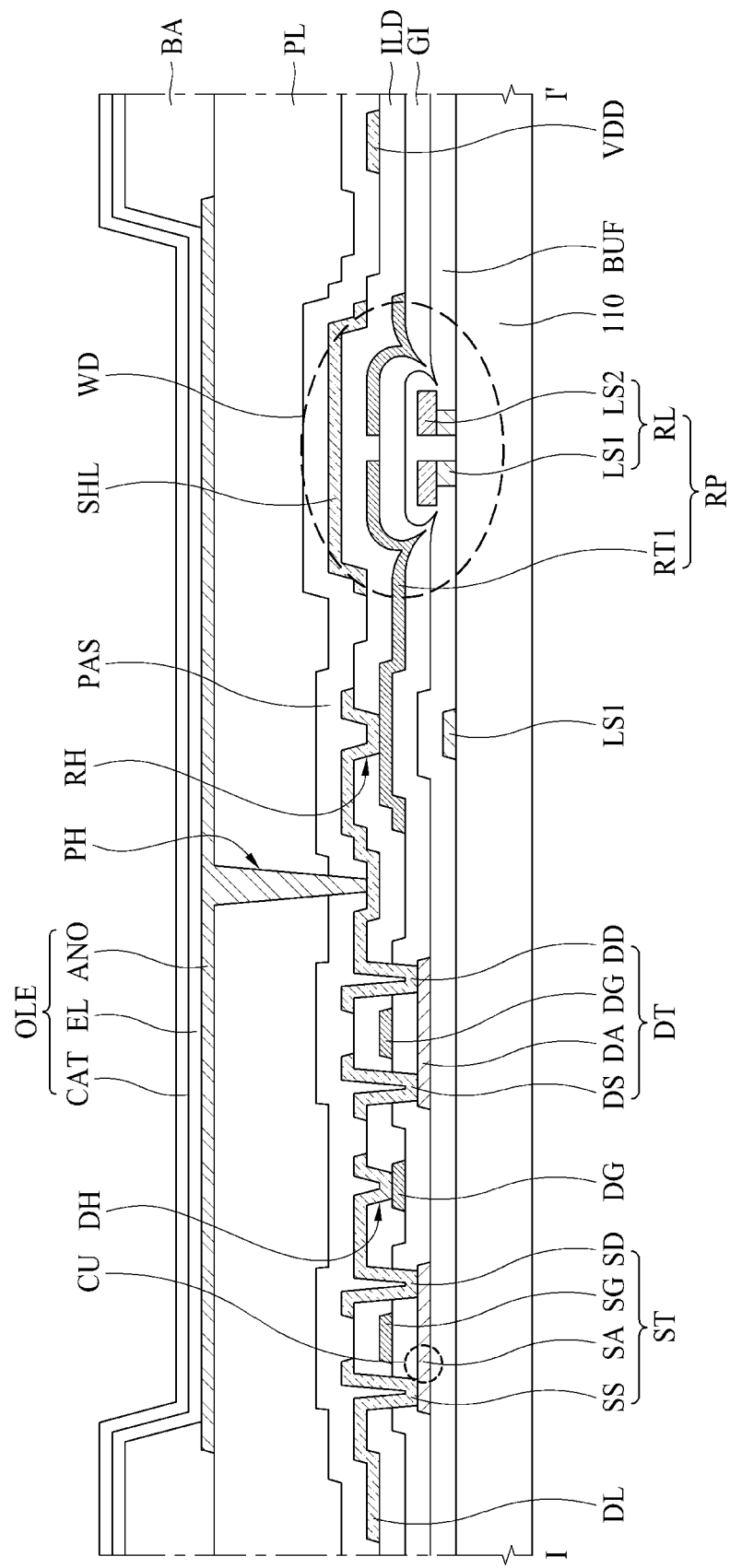
FIG. 12 is a cross-sectional view along line IV-IV' in FIG. 8, illustrating a structure of an electroluminescence display having a repair element according to the other embodiment of the present disclosure.

Hereinafter, referring to FIG. 12, still another embodiment of the present disclosure will be explained. FIG. 12 is a cross-sectional view along line IV-IV' in FIG. 8, illustrating a structure of an electroluminescence display having a repair element according to another embodiment of the present disclosure.

An electroluminescence display according to the other embodiment shown in FIG. 12 may be substantially same with the electroluminescence display shown in FIG. 9. The difference may be characterized in that the open hole OH formed in the welding part WD is formed at both ends of the repair line RL, as well as at the repair electrode RT overlapping the repair line RL.

With this structure, even when a lower energy laser is used, the repair line RL may be melted at the welding part WD, so that the connection with the repair electrode RT may be very easily. Elements of FIG. 12 using the same reference numerals as those of FIG. 9 are substantially the same. Thus, the same description may not be duplicated, and it may be easily understood with reference to the description of FIG. 9.

The features, structures, effects and so on described in the above examples of the present disclosure are included in at least one example of the present disclosure, and are not limited to only one example. Furthermore, the features, structures, effects and the likes explained in at least one example may be implemented in combination or modification with respect to other examples by those skilled in the art to which this disclosure belongs. Accordingly, contents related to such combinations and variations should be construed as being included in the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
a substrate;
a buffer layer on the substrate;
a pixel including a thin film transistor and a light emitting element that is connected to the thin film transistor, the thin film transistor including a source electrode, a drain electrode, a semiconductor layer, and a gate electrode that overlaps the semiconductor layer;
a gate insulating layer between the gate electrode and the semiconductor layer; and
a repair element that overlaps the light emitting element, the repair element including:
a repair line that is electrically connected to the drain electrode of the thin film transistor and disposed between the substrate and the buffer layer, the repair line including a first metal layer on the substrate and a second metal layer on the first metal layer; and
a repair electrode that electrically connects the repair line to the drain electrode of the thin film transistor, the repair electrode on the buffer layer and the gate insulating layer,
wherein the repair electrode and the gate insulating layer overlap the repair line.

2. The electroluminescence display according to claim 1, wherein the pixel is defective and the semiconductor layer includes a cut such that the pixel is disabled, and a portion of the repair line is physically in contact with the repair electrode such that the portion of the repair line penetrates through a portion of the buffer layer and a portion of the gate insulating layer.

3. The electroluminescence display according to claim 2, wherein a physical connection between the portion of the repair line and the portion of the repair electrode is formed via a welding process.

4. The electroluminescence display according to claim 1, wherein the light emitting element includes:
an anode electrode connected to the drain electrode of the thin film transistor, the anode electrode including a metal material;
an emission layer on the anode electrode; and
a cathode electrode on the emission layer, the cathode electrode including a transparent conductive material,
wherein light generated from the emission layer is emitted in a direction towards the cathode electrode.

5. The electroluminescence display according to claim 4, wherein the light generated from the emission layer is emitted to the cathode electrode at portions where the repair electrode overlaps the drain electrode of the thin film transistor.

6. The electroluminescence display according to claim 1, wherein the first metal layer of the repair line includes a first width, and the second metal layer includes a second width that is wider than the first width, and
wherein the repair line is covered by the buffer layer and the gate insulating layer.

7. The electroluminescence display according to claim 6, wherein the buffer layer and the gate insulating layer has a seam area that overlaps the repair line, the seam area having a thickness that is thinner than other areas of the buffer layer and the gate insulating layer that overlap the repair line, the seam area disposed along edges of the first metal layer and the second metal layer, and
wherein the repair electrode is overlapped with a part of the repair line and is disposed in the seam area on the gate insulating layer.

8. The electroluminescence display according to claim 7, wherein a physical connection between the second metal layer of the repair line and the repair electrode penetrates through the seam area to connect together the second metal layer and the repair electrode.

9. The electroluminescence display according to claim 1, wherein the repair line further includes a hole penetrating a part of the repair line that overlaps the repair electrode.

10. An electroluminescence display comprising:
a first pixel on a substrate, the first pixel including a first switching thin film transistor, a first driving thin film transistor connected to the first switching thin film transistor, and a first light emitting element connected to the first driving thin film transistor;
a second pixel on the substrate, the second pixel including a second switching thin film transistor, a second driving thin film transistor connected to the second switching thin film transistor, and a second light emitting element connected to the second driving thin film transistor; and
a repair element that overlaps the first light emitting element and the second light emitting element, the repair element including:
a repair line that extends from the first pixel to the second pixel, the repair line having a reverse-tapered shape;
a first repair electrode connected to a driving drain electrode of the first driving thin film transistor, the first repair electrode disposed at a same layer and having a same material as a gate electrode of the first switching thin film transistor, and the first repair electrode overlapping a first end of the repair line; and
a second repair electrode connected to a driving drain electrode of the second driving thin film transistor, the second repair electrode disposed at a same layer and having a same material as a gate electrode of the second switching thin film transistor, and the second repair electrode overlapping a second end of the repair line, and
a buffer layer and a gate insulating layer disposed between the repair line and the first repair electrode, and between the repair line and the second repair electrode.

11. The electroluminescence display according to claim 10, wherein the first pixel is a normal pixel that is configured to emit light and the second pixel is defective such that the second pixel cannot emit light,
a switching semiconductor layer of the second switching thin film transistor includes a cut such that the second pixel is disabled,
a portion of the first end of the repair line is in physical contact with a portion of the first repair electrode, and
a portion of the second end of the repair line is in physical contact with a portion of the second repair electrode.

12. The electroluminescence display according to claim 11, wherein a physical connection between the first end of the repair line and the first repair electrode penetrates through the buffer layer and the gate insulating layer to connect together the first end of the repair line and the portion of the first repair electrode, and wherein a physical connection between the second end of the repair line and the second repair electrode penetrates through the buffer layer and the gate insulating layer to connect together the second end of the repair line and the portion of the second repair electrode.

13. The electroluminescence display according to claim 10, wherein the first light emitting element includes:
a first anode electrode connected to the first driving thin film transistor, the first anode electrode including a metal material;
a first emission layer on the first anode electrode; and
a first cathode electrode on the first emission layer, the first cathode electrode including a transparent conductive material, wherein light generated from the first emission layer is emitted in a direction towards the first cathode electrode,
wherein the second light emitting element includes:
a second anode electrode connected to the second driving thin film transistor, the second anode electrode including the metal material;
a second emission layer on the second anode electrode; and
a second cathode electrode on the second emission layer, the second cathode electrode including the transparent conductive material, wherein light generated from the second emission layer is emitted in a direction towards the second cathode electrode.

14. The electroluminescence display according to claim 13, wherein the light generated from the first light emitting element is emitted to the first cathode electrode at portions where the first repair electrode overlaps with the first end of the repair line, and
wherein the light generated from the second light emitting element is emitted to the second cathode electrode at portions where the second repair electrode overlaps with the second end of the repair line.

15. The electroluminescence display according to claim 10, wherein the repair line includes:
a first metal layer on the substrate, the first metal layer having a first width; and
a second metal layer on the first metal layer, the second metal layer having a second width that is wider than the first width, and
wherein the repair line is covered by the buffer layer and the gate insulating layer.

16. The electroluminescence display according to claim 15, wherein the buffer layer and the gate insulating layer has a seam area that overlaps the first end of the repair line and the second end of the repair line, the seam area having a thickness that is thinner than other areas of the buffer layer and the gate insulating layer that overlap the first end of the repair line and the second end of the repair line, the seam area formed along edges of the first metal layer and the second metal layer, and
wherein the first repair electrode overlaps the first end of the repair line and is disposed in the seam area on the gate insulating layer, and the second repair electrode overlaps the second end of the repair line and is disposed in the seam area on the gate insulating layer.

17. The electroluminescence display according to claim 16, wherein a first physical connection between the second metal layer of the repair line and the first repair electrode penetrates through the seam area to connect together the second metal layer and the first repair electrode, and a second physical connection between the second metal layer of the repair line and the second repair electrode penetrates through the seam area to connect together the second metal layer and the second repair electrode.

18. The electroluminescence display according to claim 10, wherein the repair line further includes:
a first hole penetrating a part of the first end of the repair line that overlaps the first repair electrode; and
a second hole penetrating a part of the second end of the repair line that overlaps with the second repair electrode.

19. An electroluminescence display comprising:
a first pixel that is configured to emit light, the first pixel including a first switching thin film transistor, a first driving thin film transistor connected to the first switching thin film transistor, and a first light emitting element connected to the first driving thin film transistor;
a second pixel that is defective and cannot emit light, the second pixel including a second switching thin film transistor, a second driving thin film transistor connected to the second switching thin film transistor, and a second light emitting element connected to the second driving thin film transistor;
a first repair line that extends to the first pixel but not the second pixel without being electrically connected to the first pixel;
a first repair electrode connected to the first driving thin film transistor of the first pixel and overlapping the first repair line without the first repair electrode being electrically connected to the first repair line;
a second repair line that extends to the second pixel but not the first pixel and is electrically connected to the second pixel;
a second repair electrode connected to the second driving thin film transistor and the second repair line, the second repair electrode overlapping the second repair line; and
a buffer layer and a gate insulating layer including a first portion disposed between the first repair line and the first repair electrode and having a first seam area with a thickness that is thinner than other areas of the first portion of the buffer layer and the gate insulating layer that overlap the first repair line, and a second portion disposed between the second repair line and the second repair electrode and having a second seam area with a thickness that is thinner than other areas of the second portion of the buffer layer and the gate insulating layer that overlap the second repair line,
wherein a portion of the first repair electrode is in the first seam area such that the first portion of the buffer layer and the gate insulating layer are between the first repair line and the first repair electrode preventing the first repair electrode from being connected to the first repair line, and
wherein a portion of the second repair electrode is in the second seam area and a physical connection between the portion of the second repair electrode and the second repair line penetrates through the second seam area to connect together the second repair line and the portion of the second repair electrode that is in the second seam area.

20. The electroluminescence display according to claim 19, further comprising:
a third pixel that is configured to emit light, the third pixel including a third switching thin film transistor, a third driving thin film transistor connected to the third switching thin film transistor, and a third light emitting element connected to the third driving thin film transistor; and a third repair electrode connected to the third pixel and the second repair line that extends to the third pixel, the third repair electrode overlapping the second repair line, wherein a portion of the third repair electrode is in the second seam area and a physical connection between the portion of the third repair electrode and the second repair line penetrates through the second seam area to connect together the second repair line and the portion of the third repair electrode that is in the second seam area.

* * * * *